United States Patent [19]
Tanaka

[11] Patent Number: 5,802,688
[45] Date of Patent: Sep. 8, 1998

[54] METHOD OF PRODUCING ELECTRONIC PARTS WITH AN ELECTRODE PATTERN BETWEEN TWO DIELECTRIC SUBSTRATES

[75] Inventor: Hiroaki Tanaka, Osaka, Japan

[73] Assignee: Murata Manufacturing Co., Ltd., Japan

[21] Appl. No.: 715,939

[22] Filed: Sep. 19, 1996

Related U.S. Application Data

[62] Division of Ser. No. 447,255, May 22, 1995, Pat. No. 5,625,169.

[30] Foreign Application Priority Data

Jul. 4, 1994 [JP] Japan ................................. 6-152264

[51] Int. Cl.$^6$ .................................................... H01G 4/06
[52] U.S. Cl. .......................... 29/25.42; 29/602.1; 29/825; 29/854
[58] Field of Search ................................ 29/25.42, 25.41, 29/825, 25.35, 854, 602.1; 361/271, 784, 794, 792

[56] References Cited

U.S. PATENT DOCUMENTS 5,488,765  2/1996  Kubota et al. .................... 29/25.42 X

*Primary Examiner*—Carl E. Hall
*Attorney, Agent, or Firm*—Majestic, Parsons, Siebert & Hsue P.C.

[57] ABSTRACT

An electronic part is formed with two dielectric substrates joined together in a face-to-face relationship. Each substrate has an electrode pattern formed on one surface and a grounding surface on the opposite surface. The surfaces with the electrode patterns formed thereon are joined together such that the patterns match each other and are connected to each other. Corners of one of the substrates may be cut so as to expose portions of the electrode pattern on the other substrate. Indentations may be formed on corners and edges of the joined substrates and terminal electrodes and grounding electrodes may be formed in the indentations.

4 Claims, 5 Drawing Sheets

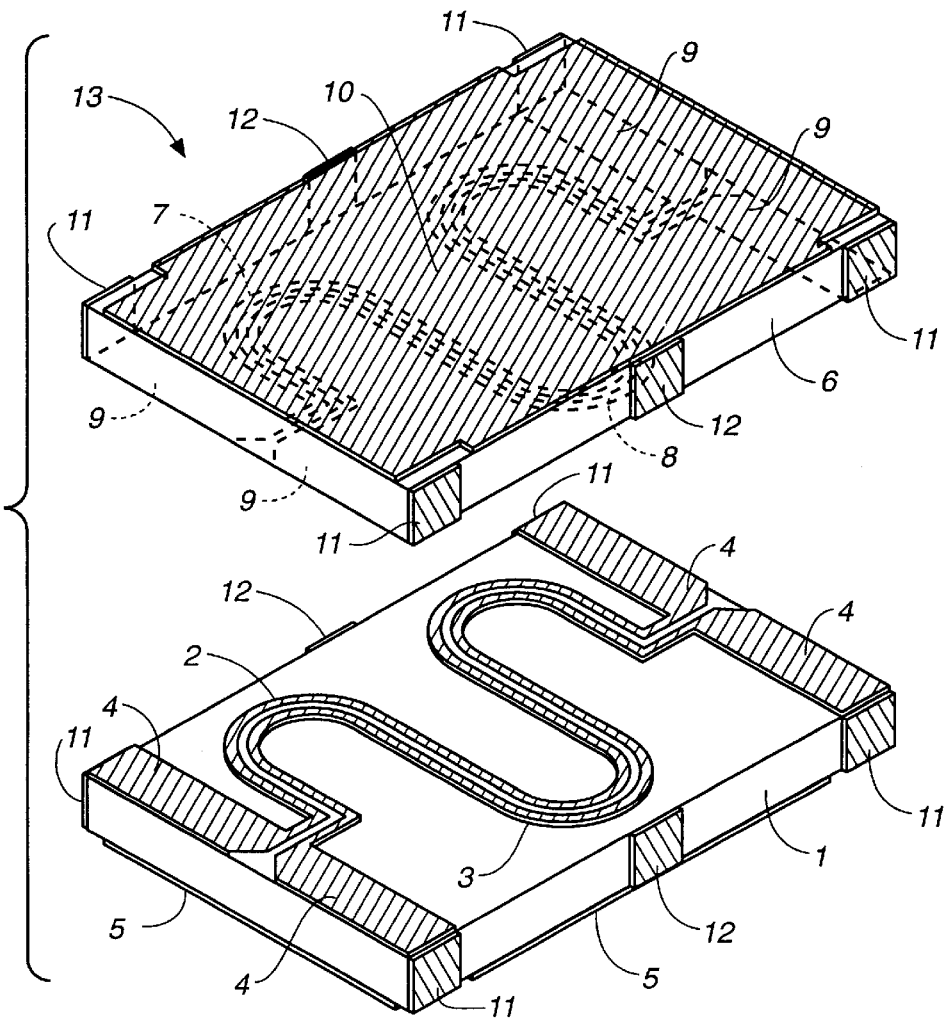
FIG._1
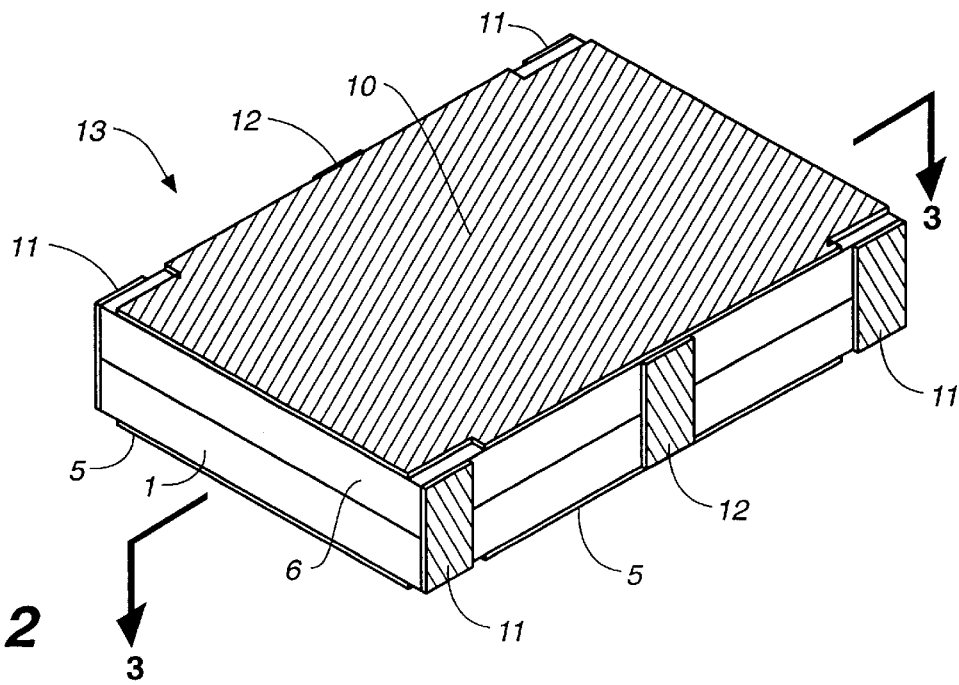
FIG._2

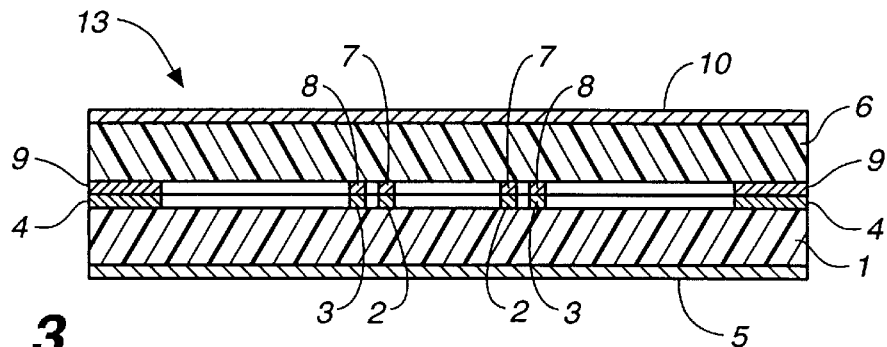
FIG._3
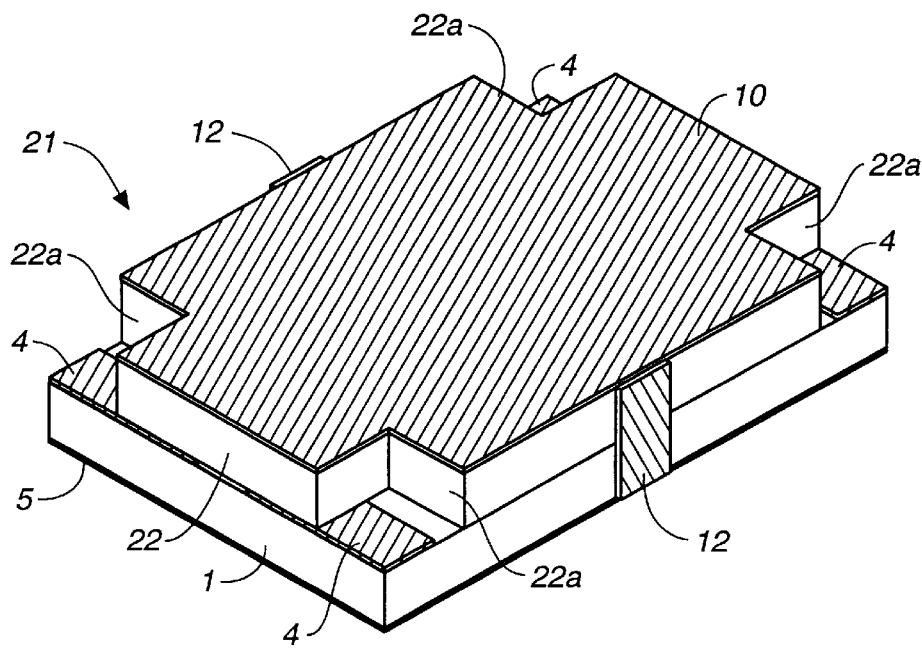
FIG._4
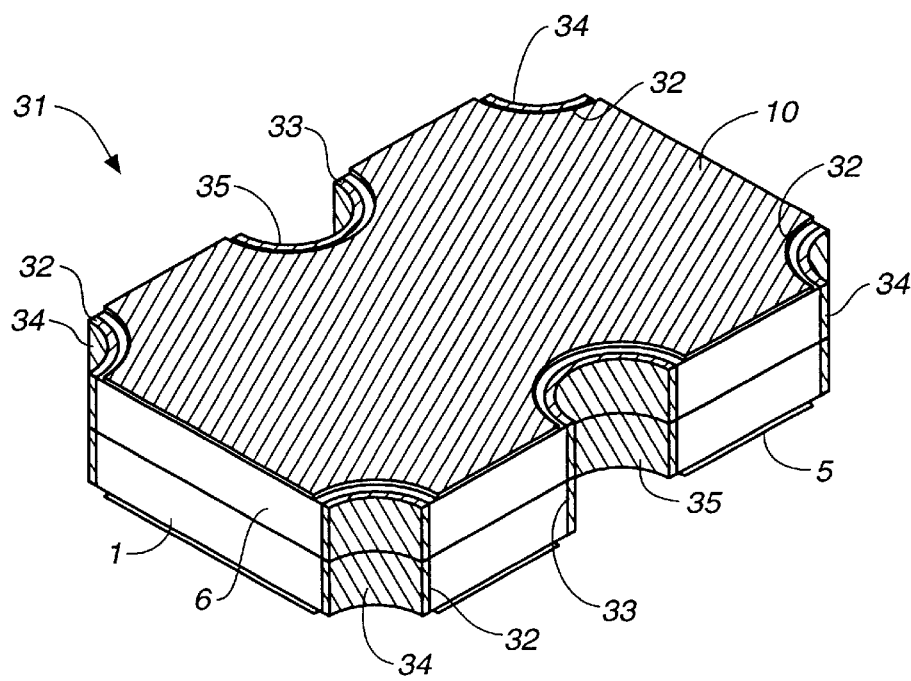
FIG._5

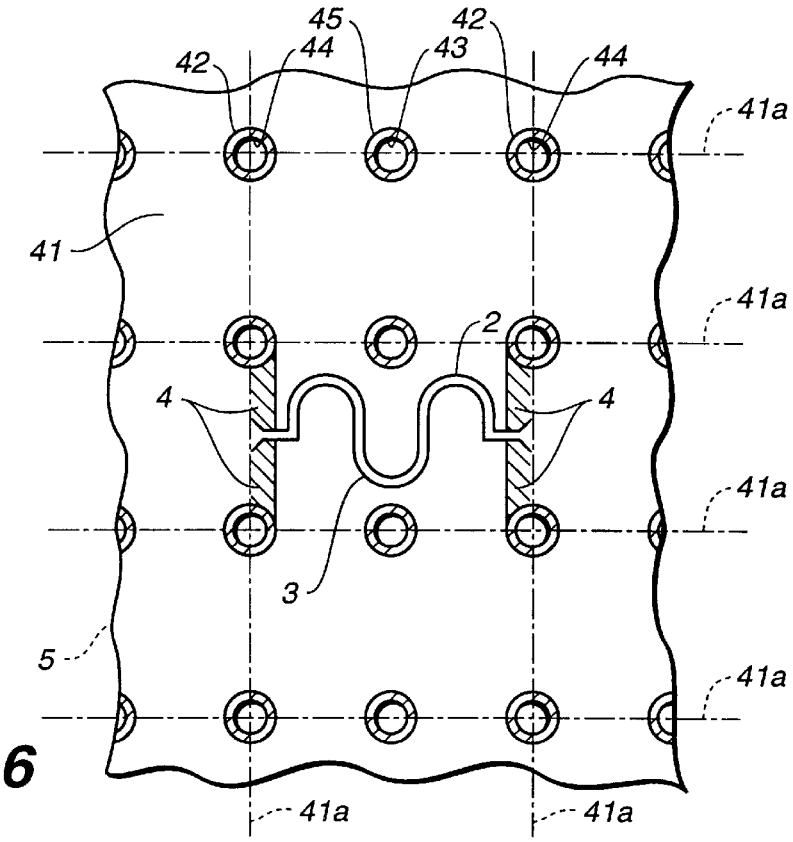
FIG._6
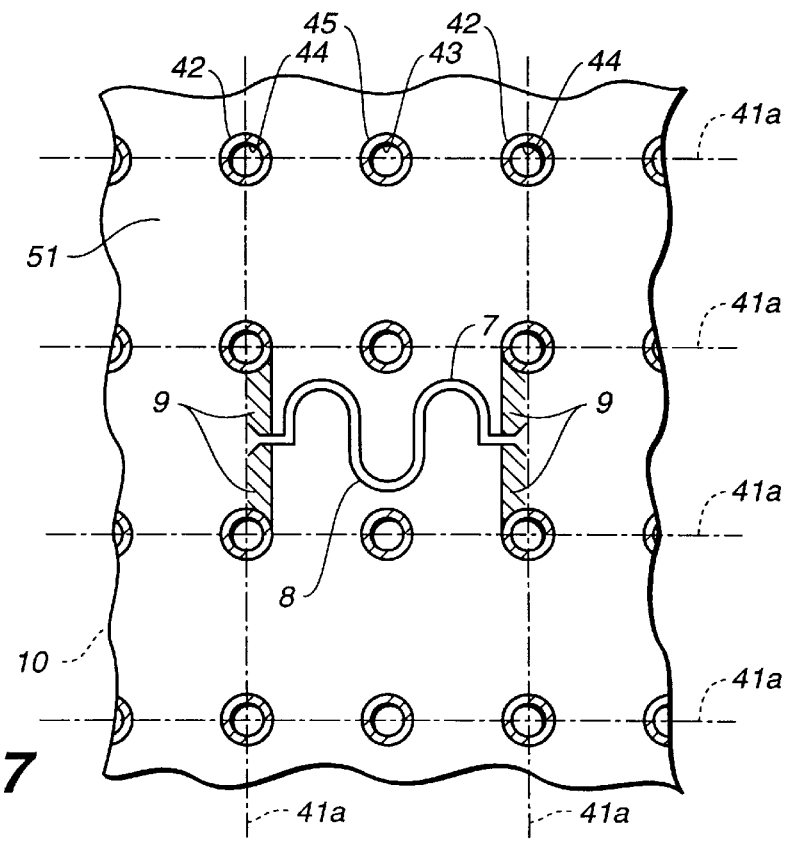
FIG._7

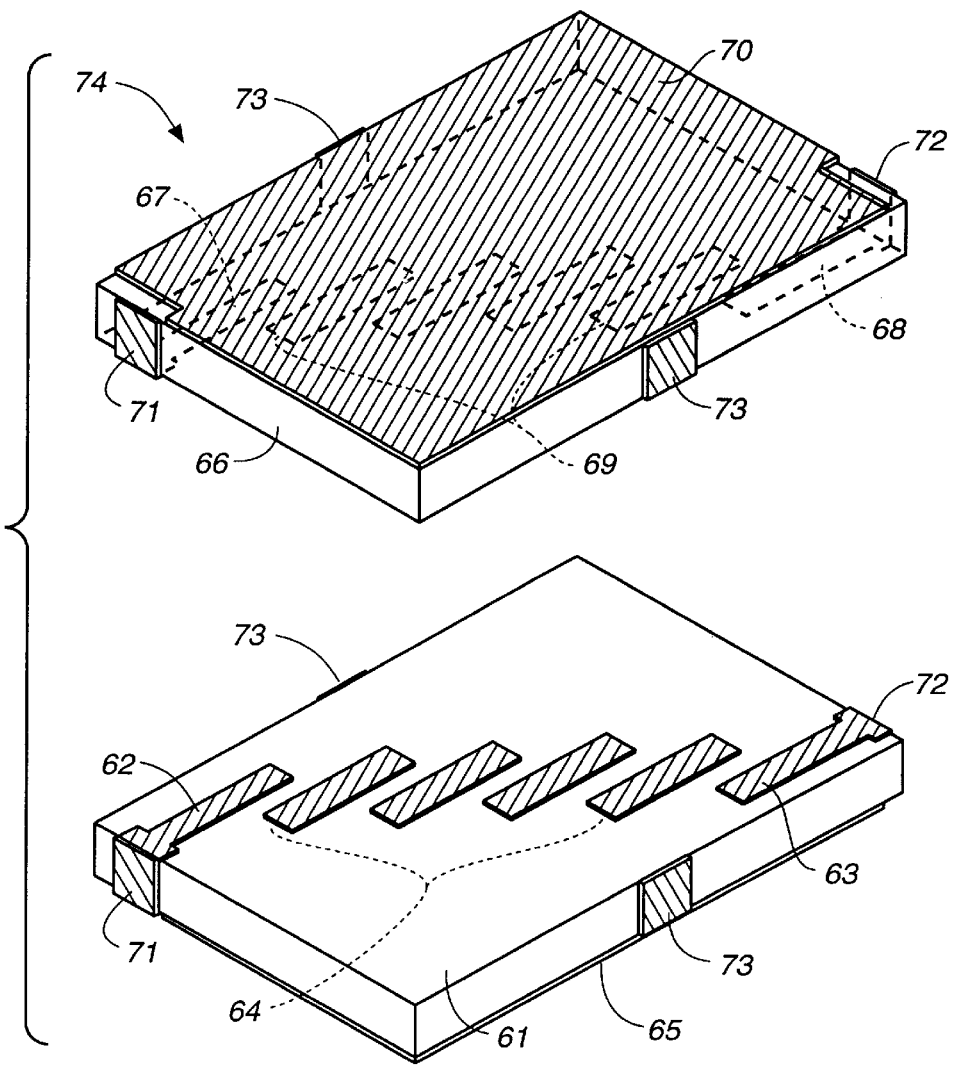
FIG._8

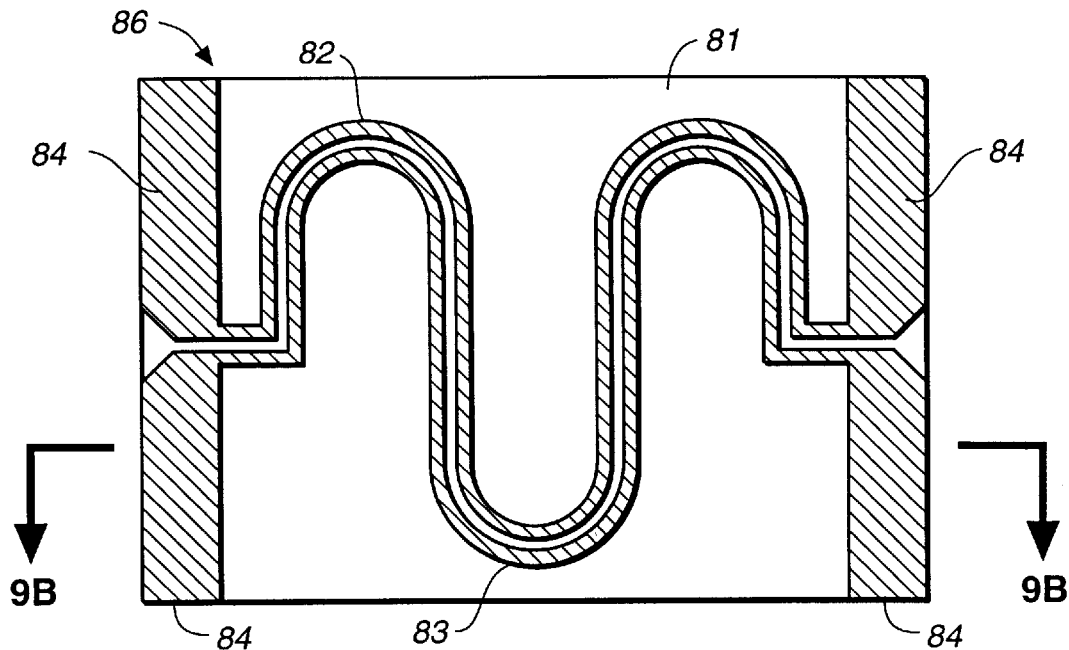
FIG._9A
(PRIOR ART)
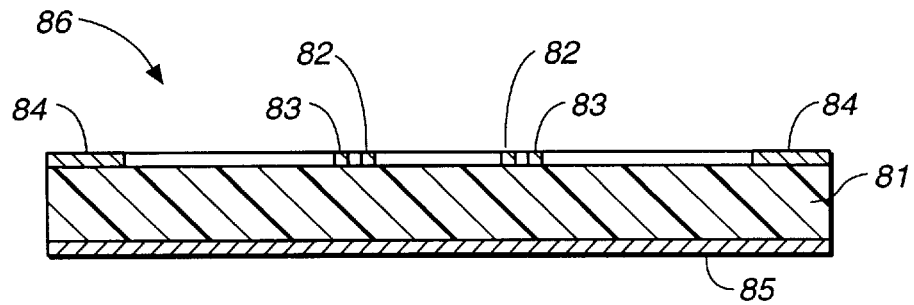
FIG._9B
(PRIOR ART)
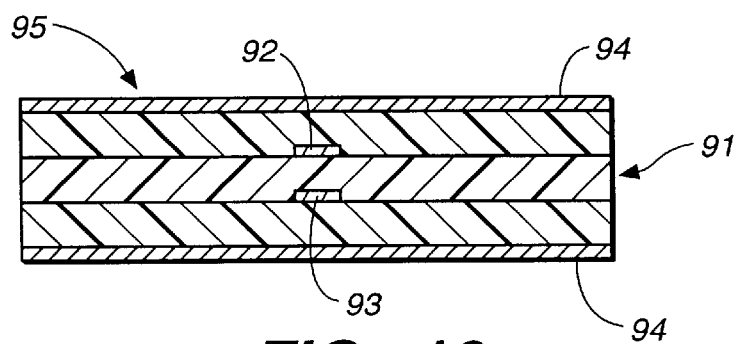
FIG._10
(PRIOR ART)

METHOD OF PRODUCING ELECTRONIC PARTS WITH AN ELECTRODE PATTERN BETWEEN TWO DIELECTRIC SUBSTRATES

This is a division of application Ser. No. 08/447,255, filed May 22, 1995, now U.S. Pat. No. 5,625,169.

BACKGROUND OF THE INVENTION

This invention relates to method of producing electronic parts for use in a high-frequency circuit, having an electrode pattern between two dielectric substrates.

As examples of prior art electronic part for use in a high-frequency circuit, two directional couplers are illustrated in FIGS. 9A, 9B and 10. The prior art directional coupler, shown at 86 in FIGS. 9A and 9B, comprises a dielectric substrate 81, on the front surface of which are formed two mutually opposite meandering coupler lines 82, 83 as an electrode pattern with their ends reaching mutually opposite edges of the dielectric substrate 81. Input/output electrodes 84 are formed on these edges of the dielectric substrate 81, connected to the ends of the coupler lines 82, 83. A grounding electrode 85 is formed on the back surface of the dielectric substrate 81. The coupler lines 82, 83, the input-output electrodes 84 and the grounding electrode 85 may be formed by any thin-film technology such as vapor deposition, sputtering and plating methods. FIG. 10 shows another prior art directional coupler 95 having a multi-layered dielectric substrate 91 and coupler lines 92, 93 formed mutually opposite to each other inside the multi-layered dielectric substrate 91 by a thick-film printing method. Grounding electrodes 94 are formed on both upper and lower surfaces of the multi-layered substrate 91.

In the case of the prior art directional coupler 86 with a high degree of coupling such as a 90° hybrid, however, the coupler lines must be made extremely fine, and hence the film must be made very thin. This has the unfavorable consequence of increasing not only the resistance but also the insertion loss when it is used as a directional coupler. In the case of the prior art directional coupler 95, on the other hand, precision in the measurements of the coupler lines 92, 93 is poor because the lines 92, 93 are formed by a thick-film printing method, and there are large fluctuations in electrical characteristics among the produced parts.

SUMMARY OF THE INVENTION

It is therefore an object of this invention to eliminate such problems of prior art electronic parts and to provide a method of producing improved electronic parts with a low insertion loss and having small fluctuations.

An improved electronic part, with which the above and other objects can be accomplished, may be characterized as comprising two dielectric substrates joined together, each substrate having an electrode pattern formed on one surface and a grounding electrode on the opposite surface such that the electrode patterns on the two substrates are joined together. One of the two substrates may have its corner parts cut off such that portions of the electrode pattern formed on the other substrate will be externally exposed. Side surface grounding electrodes may be further formed on side surfaces of the substrates now joined together. Alternatively, a plurality of indentations may be formed on side surfaces of the substrates, terminal electrodes connected to the grounding electrodes and side surface grounding electrodes being further formed inside these indentations.

Such an electronic part with indentations on side surfaces can be fabricated by forming throughholes through mother substrates, forming electrode patterns on their surfaces, throughhole electrodes inside these throughholes and grounding electrodes on the reverse surfaces of the mother substrates, joining these mother substrates together in a face-to-face relationship such that the electrode patterns thereon will match each other and connected together. Thereafter, the two mother substrates, now joined together, are cut so as to expose these throughholes.

With an electronic part thus structured, the resistance of the electrode pattern is reduced because two patterns on the two substrates are joined together. Moreover, since the electrode pattern is buried between the two dielectric substrates, the effective dielectric constant is increased.

BRIEF DESCRIPTION OF THE DRAWINGS

The accompanying drawings, which are incorporated in and form a part of this specification, illustrate embodiments of the invention and, together with the description, serve to explain the principles of the invention. In the drawings:

FIG. 1 is a diagonal view of a directional coupler as a first example of this invention when its two substrates are separated;

FIG. 2 is a diagonal external view of the directional coupler of FIG. 1 when its two substrates are assembled;

FIG. 3 is a sectional view of the directional coupler of FIG. 2 taken along line 3—3 therein;

FIG. 4 is a diagonal view of another directional coupler according to this invention;

FIG. 5 is a diagonal view of still another directional coupler according to this invention;

FIGS. 6 and 7 are each a plan view of a portion of a mother substrate (the first mother substrate and the second mother substrate, respectively) used for the production of directional couplers shown in FIG. 5;

FIG. 8 is a diagonal view of a filter serving as a second example of this invention when its two substrates are separated;

FIGS. 9A and 9B are respective a plan view and a sectional view taken along line 9B—9B in FIG. 9A of a prior art directional coupler; and FIG. 10 is a sectional view of another prior art directional coupler.

DETAILED DESCRIPTION OF THE INVENTION

FIGS. 1–3 show a directional coupler 13, as an example of electronic part embodying this invention, comprising two dielectric substrates (referred to as the first substrate 1 and the second substrate 6). On the upper surface of the first substrate 1, two meandering coupling lines 2, 3 are formed next to each other as an electrode pattern, their end parts reaching two edge parts of the substrate 1, and input/output electrodes 4 connected to the end parts of the coupling lines 2, 3 are formed on the edge parts of the substrate. A main surface grounding electrode 5 is formed on the lower surface of the substrate 1. The second dielectric substrate 6 is of a similar structure. On its lower surface, two meandering coupling lines 7, 8 are formed next to each other as another electrode pattern, their end parts reaching two edge parts of the substrate 6, and input/output electrodes 9 connected to the end parts of the coupling lines 7, 8 are formed on the edge parts. A main surface grounding electrode 10 is formed on the upper surface of the substrate 6. The coupling lines 2, 3 on the first substrate 1 and the coupling lines 7, 8 on the second substrate 6 are shaped alike when both seen from above through the substrates. Similarly, the input/output electrodes 4 and 9 on the first and second substrates 1 and 6 are shaped alike. The coupling lines 2, 3, 7, 8, the input/output electrodes 4, 9 and the grounding electrodes 5, 10 may be formed by any thin film method such as vapor deposition, sputtering or plating.

The two substrates 1, 6 thus formed are joined together, as shown in FIG. 3, such that the coupling lines 2 and 7, coupling lines 3 and 8 and the input/output electrodes 4 and 9 are tightly joined together, say, by brazing. Terminal electrodes 11, which are insulated from the main surface grounding electrodes 5, 10 but connected to the input/output electrodes 4, 9, and side surface grounding electrodes 12, which are connected to the main surface grounding electrodes 5, 10, are formed on side surfaces of the substrates 1, 6 to form a three-layer structure.

It is to be noted with the directional coupler 13, thus formed, that the coupling lines 2 with 7, the coupling lines 3 with 8 and the input/output electrodes 4 and 9 are connected in parallel to each other electrically. This means that their total resistance becomes one half and hence that the insertion loss is reduced. Since the coupling lines 2, 3, 7, 8 are formed by a thin-film technology, they can be formed with high degree of accuracy, and fluctuations in their electrical characteristics are also reduced. Since terminal electrodes and side surface grounding electrodes are made available on side surfaces, furthermore, it can be surface-mounted easily, say, onto a printed circuit board (not shown).

FIGS. 4 and 5 show variations of the directional coupler 13 of FIGS. 1–3. In FIGS. 4 and 5, those components which are substantially identical or function at least similarly to those shown in FIGS. 1–3 are indicated by the same numerals.

The directional coupler shown at 21 in FIG. 4 is different from the directional coupler 13 of FIGS. 1–3 in that cuts 22a are made at the four corners of the upper dielectric substrate 22 such that portions of the input/output electrode 4 formed on the upper surface of the lower (first) dielectric substrate 1 are exposed. A directional coupler thus formed is advantageous because connections can be made to such exposed parts of the input/output electrode 4 by wire-bonding.

The directional coupler shown at 31 in FIG. 5 is characterized as having indentations 32 each in the form of a quarter-circle formed at the four corners of the joined substrates 1 and 6 and indentations 33 each in the form of a semi-circle formed on the longer side edges of the substrates 1 and 6. Terminal electrodes 34, connected to the input/output electrodes 4, 9 but insulated from the main surface grounding electrodes 5, 10, are formed inside the quarter-circular indentations 32, and side surface grounding electrodes 35, connected to the main surface grounding electrodes 5, 10, are formed inside the semi-circular indentations 33.

To produce directional couplers shown in FIG. 5, use is made of two mother substrates (the first mother substrate 41 shown in FIG. 6 and the second mother substrate 51 shown in FIG. 7, both made in the same shape and of the same material). As shown in FIG. 6, the first mother substrate 41 has a surface area which is many times greater than that of the dielectric substrate 1 and is made of a dielectric material. A plurality of throughholes (corner throughholes) 42 are formed through the first mother substrate 41 at the intersections of mutually perpendicular sets of parallel cut lines 41a. Additional throughholes (side edge throughholes) 43 are formed between each pair of corner throughholes 42 mutually adjacent in one direction (horizontal direction in FIG. 6).

Next, an electrode pattern including a pair of meandering coupling lines 2, 3 near each other and input/output electrodes 4 is formed in each region surrounded by the cut lines 41a on the surface of the mother substrate 41. (FIG. 6 shows the electrode pattern formed only in one region.) Throughhole electrodes 44, 45 are formed on the inner walls of the throughholes 42, 43, and the main surface grounding electrode 5 is formed on the reverse surface of the mother substrate 41 simultaneously by an electroless plating method. Thereafter, end parts of the input/output electrodes 4 are connected to the plated electrodes inside the corner throughholes 42, and the main surface grounding electrode 5 is insulated from the corner throughhole electrodes 44 and connected to the side edge throughhole electrodes 45.

The second mother substrate 51, as shown in FIG. 7, is also provided with corner throughholes 42 at the intersections of mutually perpendicular sets of parallel cut lines 41a, and side edge throughholes 43 are formed as through the first mother substrate 41.

Next, an electrode pattern including a pair of meandering coupling lines 7, 8 near each other and input/output electrodes 9 is formed in each region surrounded by the cut lines 41a on the surface of the mother substrate 51. (FIG. 7, too, shows the electrode pattern formed only in one region.) Corner and side edge throughhole electrodes 44, 45 are formed on the inner walls of the throughholes 42, 43, and the main surface grounding electrode 10 is formed on the reverse surface of the mother substrate 51 simultaneously by an electroless plating method. Thereafter, end parts of the input/output electrodes 9 are connected to the plated electrodes inside the corner throughholes 42, and the main surface grounding electrode 10 is insulated from the corner throughhole electrodes 44 and connected to the side edge throughhole electrodes 45. It now goes without saying that the coupling lines 7, 8 and the input/output electrodes 9 are formed on the second mother substrate 51 symmetrically to the coupling lines 2, 3 and the input/output electrodes 4 on the first mother substrate 41.

The two mother substrates 41, 51 are thereafter joined together, say, by brazing such that their corresponding coupling lines 2 with 7 and 3 with 8 and corresponding input/output electrodes 4 and 9 are tightly in contact with each other. Next, the two mother substrates 41, 51, now joined together, are cut along the cut lines 41a, such that the throughhole electrodes 44, 45 become exposed on side surfaces to become the terminal electrodes 34 and the side surface grounding electrodes 35, as shown on the directional coupler 31 of FIG. 5.

The method of fabrication described above is advantageous because the throughhole electrodes 44, 45, which eventually become the terminal electrodes 34 and the side surface grounding electrodes 35 can be formed on the mother substrates 41 and 51 at the same time as the coupling lines 2, 3, 7, 8, input/output electrodes 4, 9 and the main surface grounding electrodes 5, 10. Thus, it is not necessary to form the terminal electrodes 34 and the side surface grounding electrodes 35 on the side surfaces of individual directional couplers. In summary, the present invention provides simplified fabrication process by which the yield can be improved.

FIG. 8 shows a filter 74, as a second example of electronic part embodying the invention, comprising two dielectric substrates (the first substrate 61 and the second substrate 66).

As an electrode pattern, an input electrode 62 and an output electrode 63 are formed on opposite edge parts of the upper surface, a plurality of coupling lines 64 each having one-half wavelength are formed individually and in a step-like formation between the input electrode 62 and the output electrode 63, and a main surface grounding electrode 65 is formed on the lower surface of the first substrate 61. Similarly, as another electrode pattern, an input electrode 67 and an output electrode 68 are formed on opposite edge parts of the lower surface of the second substrate 66, a plurality of coupling lines 69 each having one-half wavelength are formed individually and in the same step-wise formation between the input electrode 67 and the output electrode 68, and a main surface grounding electrode 70 is formed on the upper surface of the second substrate 66. The input and output electrodes 67 and 68 and the coupling lines 69 formed on the second substrate 66 are of the same shape as the input and output electrodes 62 and 63 and the coupling lines 64 formed on the first substrate 61, as seen above through the substrates 61 and 62. Although not separately illustrated, the first and second substrates 61, 66 are joined together such that the corresponding electrodes and coupler lines formed thereon match each and are connected together electrically. Thereafter, terminal electrodes 71, 72, which are insulated from the main surface grounding electrodes 65, 70 but connected to the input and output electrodes 62, 63, 67, 68, and side surface grounding electrodes 73 connected to the main surface grounding electrodes 65, 70 are formed on side surfaces to complete the production of the filter 74.

With a filter formed as described above, too, each electrode and coupling line is formed as a parallel combination of two parts originally formed separately on the two substrates and hence has its resistance halved. Thus, the insertion loss is reduced by this example, too.

Although this invention has been described with reference to only two examples, these examples are not intended to limit the scope of the invention. Many modifications and variations are possible within the scope of this invention. In summary, electronic parts according to this invention are characterized as having electrode patterns formed on two dielectric substrates and having such substrates joined together such that the electrode patterns formed thereon are joined together and hence that the resistance of the electrode patterns is halved and the insertion loss due to the patterns is reduced. Since the insertion loss is thus reduced, the electrode patterns can be formed by the thin-film technology, such that fluctuations in electrical characteristics among the fabricated parts can be minimized. Moreover, since the electrode patterns are buried between two dielectric substrates, effective dielectric constant is increased and the part as a whole can be made compact.

What is claimed is:

1. A method of forming electronic parts comprising the steps of:

forming throughholes through two mother substrates each having a first surface and a second surface opposite said first surface;

forming mutually symmetric electrode patterns on the first surfaces of said mother substrates, throughhole electrodes inside said throughholes through said mother substrates, and grounding electrodes on the second surfaces of said mother substrates;

joining said two mother substrates together with the first surfaces opposite to each other and thereby causing the electrode patterns on said two mother substrates to match and be connected to each other; and cutting said joined mother substrates through said throughholes and thereby exposing said throughhole electrodes.

2. The method of claim 1, wherein side surfaces are exposed by said step of cutting said joined mother substrates, said method further comprising the steps of providing terminal electrodes on said side surfaces and connected to said electrode patterns and providing side surface grounding electrodes on said side surfaces and connected to said main surface grounding electrodes.

3. The method of claim 1, whereby individual electronic parts are separated by said step of cutting said joint mother substrates, each of said individual electronic parts having a substantially rectangular first substrate and a substantially rectangular second substrate with corner parts removed such that corner parts of the electrode pattern on said first substrate are exposed.

4. The method of claim 1, whereby individual electronic parts are separated by said step of cutting said joint mother substrates, each of said individual electronic parts having substantially rectangular substrates with indentations on corners and side edges.

* * * * *